(12) United States Patent
Chiba et al.

(10) Patent No.: US 11,218,091 B2
(45) Date of Patent: Jan. 4, 2022

(54) DIELECTRIC ELASTOMER POWER GENERATION SYSTEM

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Mitsuaki Ito, Ageo (JP); Makoto Sawada, Ageo (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 202 days.

(21) Appl. No.: 16/487,979

(22) PCT Filed: Feb. 23, 2018

(86) PCT No.: PCT/JP2018/006623
§ 371 (c)(1),
(2) Date: Aug. 22, 2019

(87) PCT Pub. No.: WO2018/163854
PCT Pub. Date: Sep. 13, 2018

(65) Prior Publication Data
US 2020/0252010 A1   Aug. 6, 2020

(30) Foreign Application Priority Data
Mar. 9, 2017   (JP) .............................. JP2017-044829

(51) Int. Cl.
*H02N 11/00*   (2006.01)
*H02J 7/00*   (2006.01)
*H02J 7/34*   (2006.01)

(52) U.S. Cl.
CPC .......... *H02N 11/002* (2013.01); *H02J 7/0013* (2013.01); *H02J 7/345* (2013.01)

(58) Field of Classification Search
CPC ........ H02J 7/0013; H02J 7/345; H02J 7/0014; H02J 7/0019; H02J 7/0024; H02J 7/0025; H02J 7/36
See application file for complete search history.

(56) References Cited

U.S. PATENT DOCUMENTS

| 8,773,004 B2 * | 7/2014 | Despesse | ............... H02N 2/181 |
| | | | 310/339 |
| 10,734,921 B2 * | 8/2020 | Arulandu | ................. H02N 1/04 |

(Continued)

FOREIGN PATENT DOCUMENTS

| DE | 102007060329 A1 | 7/2009 |
| JP | 5479659 B2 | 4/2014 |

(Continued)

OTHER PUBLICATIONS

May 1, 2018, International Search Report issued in the International Patent Application No. PCT/JP2018/006623.

(Continued)

*Primary Examiner* — Nguyen Tran
(74) *Attorney, Agent, or Firm* — Kenja IP Law PC

(57) ABSTRACT

Provided are: a power generator including a dielectric elastomer element with an elastomer layer and electrodes sandwiching the layer; an intermediate power storage including a specific number of capacitors to receive output power from the power generator; a storage unit to receive output power from the intermediate power storage; and a controller for setting control by switching a mode between an input mode and an output mode. In the input mode, some number of the capacitors of the intermediate power storage are connected to the power generator such that a series number is an input series number of less than or equal to the specific number. In the output mode, some number of the capacitors are connected to the storage unit such that the series number is (Continued)

an output series number which is smaller than the input series number.

4 Claims, 7 Drawing Sheets

(56) References Cited

U.S. PATENT DOCUMENTS

| | | |
|---|---|---|
| 2001/0032663 A1 | 10/2001 | Pelrine et al. |
| 2001/0035723 A1 | 11/2001 | Pelrine et al. |
| 2008/0218132 A1 | 9/2008 | Pelrine et al. |
| 2015/0035408 A1* | 2/2015 | Despesse ............... H02N 1/08 310/310 |

FOREIGN PATENT DOCUMENTS

| | | |
|---|---|---|
| JP | 5509350 B2 | 6/2014 |
| JP | 2015154628 A | 8/2015 |

OTHER PUBLICATIONS

Dec. 2, 2020, the Extended European Search Report issued by the European Patent Office in the corresponding European Patent Application No. 18764391.1.

* cited by examiner

DIELECTRIC ELASTOMER POWER GENERATION SYSTEM

TECHNICAL FIELD

The present invention relates to a dielectric elastomer power generation system.

BACKGROUND ART

Development of dielectric elastomer elements having a dielectric elastomer layer and a pair of electrode layers that sandwich the dielectric elastomer layer is ongoing in the respective fields of drive applications and power generation applications. Patent Documents 1 and 2 disclose a dielectric elastomer power generation system in which a dielectric elastomer element is used in power generation applications. In this dielectric elastomer power generation system, power is generated by converting an external force (dynamic energy) that elongates the dielectric elastomer element into electrical energy. Electric power resulting from this power generation is stored in secondary batteries typified by nickel-hydrogen batteries and lithium-ion batteries, for example.

Power generation using a dielectric elastomer element is performed in cycles each consisting of elongation and contraction of the dielectric elastomer element. This is advantageous in that, even when change in the external force or the like that produces this cycle occurs in comparatively short periods of time, the elongation and contraction of the dielectric elastomer element is capable of conforming to this change. Also, an aspect of power generation with a dielectric elastomer element is that the voltage is comparatively high, reaching several thousand volts, for example. On the other hand, since the abovementioned secondary batteries employ a power storage principle utilizing a chemical reaction, charging requires a comparatively long time. Also, the proper voltage for charging secondary batteries is overwhelmingly low compared with the voltage of power generation by a dielectric elastomer element. Thus, difficulties are encountered in efficiently storing power generated using a dielectric elastomer element in secondary batteries.

PRIOR ART DOCUMENT

Patent Documents

Patent Document 1: JP 5479659
Patent Document 2: JP 5509350

SUMMARY OF THE INVENTION

Problem to be Solved by the Invention

The present invention has been conceived under the abovementioned circumstances, and an object thereof is to provide a dielectric elastomer power generation system capable of storing power more efficiently.

Means for Solving the Problem

A dielectric elastomer power generation system provided according to a first aspect of the present invention includes a power generation unit including a dielectric elastomer power generation element having a dielectric elastomer layer and a pair of electrode layers that sandwich the dielectric elastomer layer, an intermediate power storage unit including a plurality of capacitors of a specific number and configured to receive input of output power from the power generation unit, a power storage unit configured to receive input of output power from the intermediate power storage unit, and a control unit configured to perform setting control by switching a mode between an input mode and an output mode, whereby, in the input mode, some number of the plurality of capacitors of the intermediate power storage unit are connected to the power generation unit such that a series number is an input series number of less than or equal to the specific number, and, in the output mode, some number of the plurality of capacitors are connected to the power storage unit such that the series number is an output series number which is smaller than the input series number.

In a preferred embodiment of the present invention, the control unit, in the output mode, connects the capacitors of a number less than or equal to the input series number and larger than the output series number to each other in parallel.

A dielectric elastomer power generation system provided according to a second aspect of the present invention includes a power generation unit including a dielectric elastomer power generation element having a dielectric elastomer layer and a pair of electrode layers that sandwich the dielectric elastomer layer, an intermediate power storage unit including a plurality of capacitors of a specific number and configured to receive input of output power from the power generation unit, a power storage unit configured to receive input of output power from the intermediate power storage unit, and a control unit configured to perform setting control by switching a mode between an input mode, an intermediate mode and an output mode, whereby, in the input mode, some number of the plurality of capacitors of the intermediate power storage unit are connected to the power generation unit such that a series number is an input series number of less than or equal to the specific number, in the intermediate mode, the plurality of capacitors in the input mode and the power generation unit are disconnected, some number of the plurality of capacitors connected to the power generation unit in the input mode are connected such that the series number is an intermediate output series number which is smaller than the input series number, and some number of capacitors other than the plurality of capacitors connected to the power generation unit in the input mode, among the plurality of capacitors, are connected such that the series number is an intermediate input series number which is larger than the intermediate output series number, and power is output from the plurality of capacitors connected in the intermediate output series number to the plurality of capacitors connected so as to be in the intermediate input series number, and, in the output mode, the plurality of capacitors connected in the intermediate input series number are connected to the power storage unit such that the series number is an output series number which is smaller than the intermediate input series number.

In a preferred embodiment of the present invention, the control unit, in the output mode, connects the capacitors of a number less than or equal to the input series number and larger than the output series number to each other in parallel.

Other features and advantages of the present invention will become apparent from the detailed description given below with reference to the accompanying drawings.

MODE FOR CARRYING OUT THE INVENTION

Hereinafter, preferred embodiments of the present invention will be specifically described, with reference to the drawings.

Figure 1:
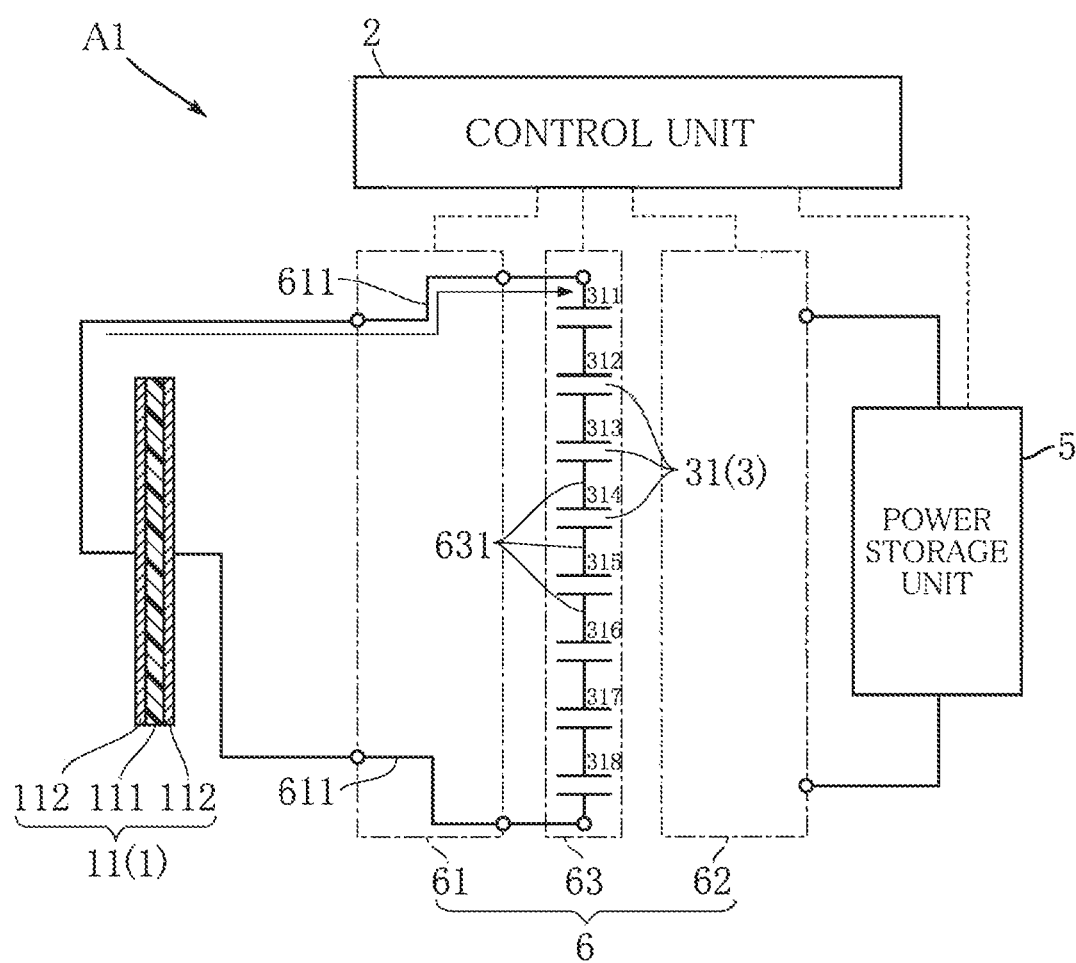
FIG. 1 is a system configuration diagram schematically showing a dielectric elastomer power generation system that is based on a first embodiment of the present invention.
Figure 2:
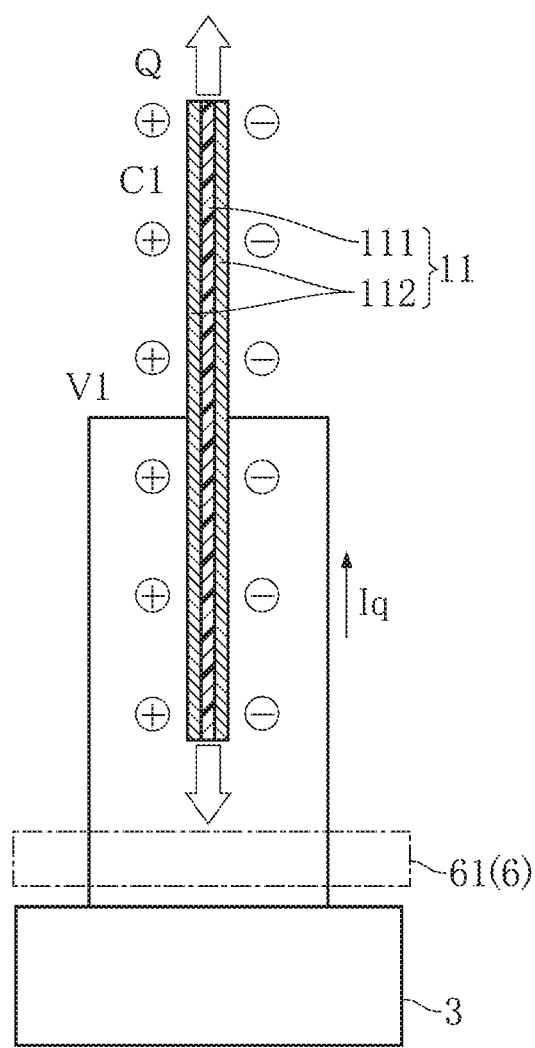
FIG. 2 is a diagram schematically showing the power generation principle of a dielectric elastomer power generation element of the dielectric elastomer power generation system of FIG. 1.
Figure 3:
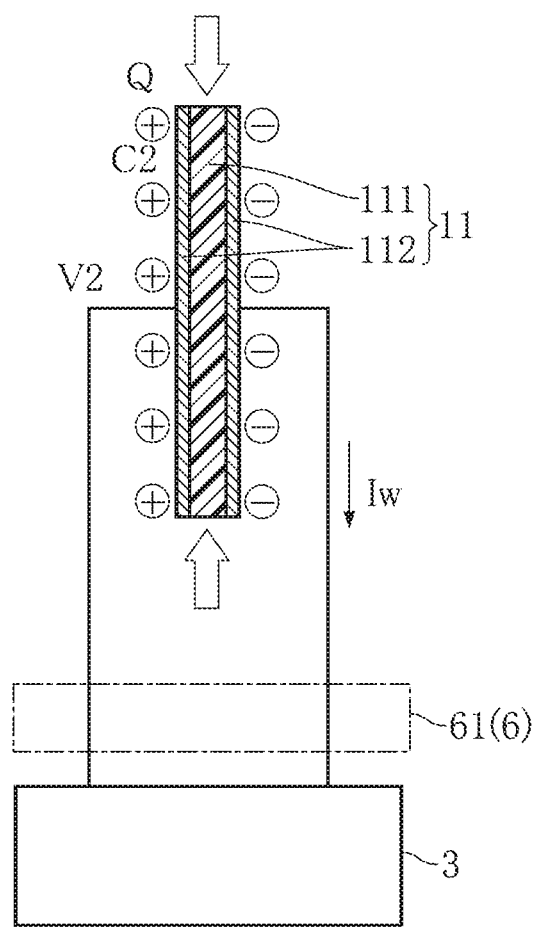
FIG. 3 is a diagram schematically showing the power generation principle of the dielectric elastomer power generation element of the dielectric elastomer power generation system of FIG. 1.

FIGS. 1 to 3 show a dielectric elastomer power generation system that is based on a first embodiment of the present invention. A dielectric elastomer power generation system A1 of the present embodiment is provided with a power generation unit 1, a control unit 2, an intermediate power storage unit 3, a power storage unit 5, and a switch unit 6. The dielectric elastomer power generation system A1 is an apparatus that generates power utilizing an external force. The specific configuration of the source that produces the external force is not particularly limited, and sources that produce natural energy typified by ocean waves and sources that produce bioenergy such as the human body can be utilized as appropriate.

FIG. 1 is a system configuration diagram schematically showing the dielectric elastomer power generation system A1. FIGS. 2 and 3 are diagrams schematically showing the power generation principle of a dielectric elastomer power generation element 11 of the dielectric elastomer power generation system A1.

The power generation unit 1 is for converting mechanical energy into electrical energy in the dielectric elastomer power generation system A1. The power generation unit is provided with the dielectric elastomer power generation element 11. Note that FIGS. 1 to 3 schematically show the dielectric elastomer power generation element 11. The dielectric elastomer power generation element 11 has a dielectric elastomer layer 111 and a pair of electrode layers 112. Note that, in the power generation unit 1, components (all omitted in the drawings) such as a structural member for transmitting the input external force to the dielectric elastomer power generation element 11 and a tension maintaining mechanism for causing tension that is utilized in realizing a power generation operation to be produced in the dielectric elastomer power generation element 11 may be provided as appropriate, in addition to the dielectric elastomer power generation element 11.

The dielectric elastomer layer 111 is required to be elastically deformable and have high insulation strength. Although the material of such a dielectric elastomer layer 111 is not particularly limited, a silicone elastomer and an acrylic elastomer, for example, are given as preferred examples.

The pair of electrode layers 112 sandwich the dielectric elastomer layer 111, and are parts to which an initial electric charge is provided and where the output voltage occurs. The electrode layers 112 have conductivity, and are formed using an elastically deformable material that can conform to the elastic deformation of the dielectric elastomer layer 111. A material obtained by mixing an elastically deformable main material with a filler that provides conductivity is given as an example of such a material. Carbon nanotubes, for example, are given as a preferred example of the filler.

The dielectric elastomer power generation element 11, in a state where an external force or a constraint from outside is not being received and a voltage is not being applied to the pair of electrode layers 112, is in a natural length state in which elongation and contraction does not occur spontaneously, and, in the case where an external force is applied, elastic deformation of the dielectric elastomer layer 111 is allowed.

The control unit 2 controls application of an initial voltage to the pair of electrode layers 112 of the dielectric elastomer power generation element 11 and input of output power from the pair of electrode layers 112 to the intermediate power storage unit 3 and the power storage unit 5. Also, the control unit 2 performs switch control of the switch unit 6 at the time of this application and input. Such a control unit 2 includes, for example, a power source unit that produces the initial electric charge, a transformation unit that achieve functions such as performing transformation to a voltage suitable for utilization of output power, and a CPU that controls the power source unit and the transformation unit.

The intermediate power storage unit 3 is for temporarily storing the power generated by the power generation unit 1. The intermediate power storage unit 3 includes a plurality of capacitors 31. The plurality of capacitors 31 are intended to be connected to each other in series or in parallel by the switch unit 6, at the time of temporary power storage and output to the power storage unit 5 which will be described later. The specific configuration of such a plurality of capacitors 31 is changeable as appropriate depending on the configuration of the switch unit 6. In the example illustrated in FIG. 1, a configuration is adopted in which the plurality of capacitors 31 are disposed separately to each other, and the state in which the capacitors 31 are connected to each other is set by the switch unit 6. The specific type of the capacitors 31 is not particularly limited, and various types of capacitors such as electric double layer capacitors, ceramic capacitors and electrolytic capacitors can be employed.

In the present embodiment, the number of capacitors 31 included in the intermediate power storage unit 3 is eight. In this case, the specific number referred to in the present invention is eight. Below, the plurality of capacitors 31 may be distinguished as capacitors 311 to 318 for convenience of description. Note that, in the present embodiment, an example using capacitors 311 to 318 of uniform capacitance is shown, but capacitors having different capacitances may be combined, and any configuration thereof is possible. The number of capacitors 31 is also not limited to eight.

The power storage unit 5 receives input of the power that is temporarily stored in the intermediate power storage unit 3, and is the final power storage means in the dielectric elastomer power generation system A1. The configuration of the power storage unit 5 is not particularly limited, and need only be provided with a power storage capacity capable of appropriately storing the power that is generated by the power generation unit 1. A nickel-hydrogen battery or a lithium-ion battery, for example, is given as a so-called secondary battery constituting the power storage unit 5. Also, the power storage unit 5 may be provided with a step-down circuit that lowers the input voltage to a voltage suitable for the secondary battery.

The switch unit 6 is for switching the connection state of the intermediate power storage unit 3 with the power generation unit 1 and the power storage unit 5, and the connection state of the plurality of capacitors 31. The specific configuration of the switch unit 6 is not particularly limited, and the switch unit 6 may be constituted by a wiring circuit including the required number of switch components, or may be constituted by an electronic module typified by a so-called switching element. In FIG. 1, the switch unit 6 is schematically shown, as a convenience for describing the functions thereof. In the present embodiment, the switch unit 6 consists of an input-side switch unit 61, an output-side switch unit 62, and an intermediate switch unit 63. The input-side switch unit 61 is a part connecting the power generation unit 1 and the intermediate power storage unit 3. The output-side switch unit 62 is a part connecting the intermediate power storage unit 3 and the power storage unit 5. The intermediate switch unit 63 is a part connecting the plurality of capacitors in a predetermined connection state. In the present embodiment, the input-side switch unit 61, the output-side switch unit 62 and the intermediate switch unit 63 execute switching operations according to a command of the control unit 2. Note that a configuration may be adopted in which the control unit 2 and the switch unit 6 are constructed as an integrated component. Alternatively, the intermediate power storage unit 3 and the intermediate switch unit 63 may be constituted as an integrated package unit.

The input-side switch unit 61 disconnects and connects the power generation unit 1 and the intermediate power storage unit 3, according to a command of the control unit 2. The input-side switch unit 61 internally generates an input path 611, for example, in the case of connecting the power generation unit 1 and the intermediate power storage unit 3. The input path 611 is for connecting an output terminal of the power generation unit 1 and any terminal of the intermediate switch unit 63.

The output-side switch unit 62 disconnects and connects the intermediate switch unit 63 and the power storage unit 5, according to a command of the control unit 2. FIG. 1 shows a state where the output-side switch unit 62 is not connecting the intermediate switch unit 63 and the power storage unit 5. Also, the output-side switch unit 62 internally generates an output path 621 shown in FIG. 4, for example, in the case of connecting the intermediate switch unit 63 and the power storage unit 5. The output path 621 is for connecting any terminal of the intermediate switch unit 63 and an input terminal of the power storage unit 5.

The intermediate switch unit 63 is for selecting any number of capacitors 31 among the plurality of capacitors 31 of the intermediate power storage unit 3, and connecting these capacitors 31 in any connection state, according to a command of the control unit 2. In the example shown in FIG. 1, the intermediate switch unit 63 internally generates an intermediate path 631 that connects the capacitors 311 to 318 to each other in series.

FIGS. 2 and 3 show the principle of power generation in the dielectric elastomer power generation element 11. The dielectric elastomer power generation element 11 is in a state of being connectable to the intermediate power storage unit 3 via the input-side switch unit 61 of the switch unit 6. In FIG. 2, an external force acting downward in the diagram is applied to the dielectric elastomer power generation element 11. Thus, the dielectric elastomer layer 111 of the dielectric elastomer power generation element 11 elongates in the up-down direction in the diagram. The area of the dielectric elastomer layer 111 thereby increases and the thickness decreases. The pair of electrode layers 112 conform to the dielectric elastomer layer 111, and increase in area. In this state, in the case where the dielectric elastomer power generation element 11 is regarded as a capacitor, a capacitance C1 thereof has increased compared with before the external force is applied. The initial voltage is applied to the dielectric elastomer power generation element 11 in this state. Specifically, by applying a voltage V1 to the dielectric elastomer power generation element 11 having the capacitance C1, flow of a current Iq occurs, and an electric charge Q is imparted. This application may be realized by applying a voltage from a power source unit built into the control unit 2, or a voltage may be applied utilizing the intermediate power storage unit 3 in a power storage state. In FIG. 2, the case where a voltage is applied from the intermediate power storage unit 3 is shown for convenience.

FIG. 3 shows a state where the dielectric elastomer power generation element 11 has contracted from the state shown in FIG. 2, due to the external force weakening or becoming zero after the state shown in FIG. 2. In this state, the area of the dielectric elastomer layer 111 decreases and the thickness increases. The pair of electrode layers 112 conform to the dielectric elastomer layer 111, and decrease in area. In this state, in the case where the dielectric elastomer power generation element 11 is regarded as a capacitor, a capacitance C2 thereof has decreased to lower than the abovementioned capacitance C1. However, the electric charge Q stored in the pair of electrode layers 112 is constant. Thus, the ratio of the voltage V2 and the voltage V1 is in an inverse proportional relationship with the ratio of the capacitance C2 and the capacitance C1, and the voltage V2 is high compared to the voltage V1. Accordingly, an output current Iw is received from the pair of electrode layers 112 by the intermediate power storage unit 3 at the voltage V2 that is higher than the voltage V1. Output power exceeding the power required in application of the initial voltage is thereby obtained. Power generation in the dielectric elastomer power generation element 11 is as described above.

Next, power generation and power storage operations of the dielectric elastomer power generation system A1 will be described below, with reference to FIG. 1 and FIGS. 4 to 6.

FIG. 1 shows a state where power generation is being performed in the power generation unit 1 of the dielectric elastomer power generation system A1. In this state, the intermediate switch unit 63 connects the eight capacitors 311 to 318 to each other in series, by generating the intermediate path 631, according to a command of the control unit 2. In the present invention, the number of series capacitors 31 that are connected to each other by the intermediate switch unit 63 of the switch unit 6 in an input mode is defined as an input series number. The input series number is less than or equal to the abovementioned specific number, and, in the present embodiment, the input series number is eight, and is the same number as the specific number. Also, the input-side switch unit 61 of the switch unit 6 is connecting the power generation unit 1 and the intermediate switch unit 63. The eight capacitors 311 to 318 connected in series to each other are connected to the power generation unit 1. On the other hand, the output-side switch unit 62 is not connecting the intermediate switch unit 63 and the power storage unit 5. In the present invention, this mode is defined as the input mode, in which power from the power generation unit 1 is input to the intermediate power storage unit 3. Note that the specific number and the input series number are not limited to being the same number, and the input series number may be smaller than the specific number.

When the dielectric elastomer power generation element 11 of the power generation unit 1 elongates and contracts in this state, power is generated in the dielectric elastomer power generation element 11, according to the principle described with reference to FIGS. 2 and 3.

Figure 5:
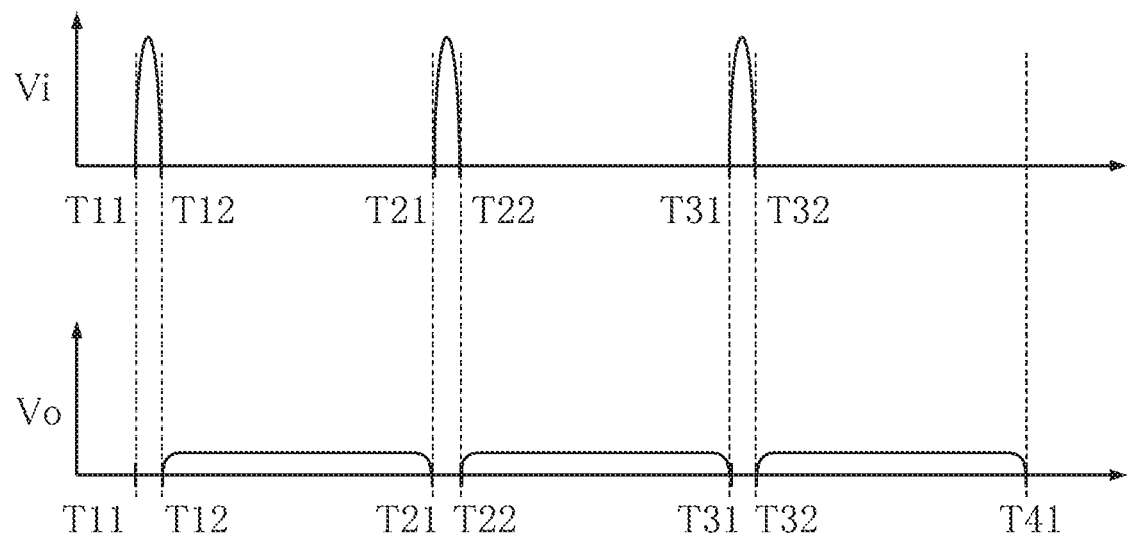
FIG. 5 is a graph showing states of power generation by the dielectric elastomer power generation system of FIG. 1.

In the graph in the upper part of FIG. 5, the horizontal axis is a time axis and the vertical axis is the input voltage Vi to the intermediate power storage unit 3. The input voltage Vi corresponds to the difference between the abovementioned voltages V2 and V1. At times T11 to T12 that are illustrated, the switch unit 6 is in the input mode, according to a command of the control unit 2. Due to the elongation and contraction of the dielectric elastomer power generation element 11, the input voltage Vi increases, and power is input to the intermediate power storage unit 3 according to this voltage. In the present embodiment, the capacitors 311 to 318 are connected to the power generation unit 1 in the input mode. Thus, power is input at the input voltage Vi to the capacitors 311 to 318 that are connected to each other in series. That is, one eighth voltage of the input voltage Vi will be applied to each of the capacitors 311 to 318.

Figure 4:
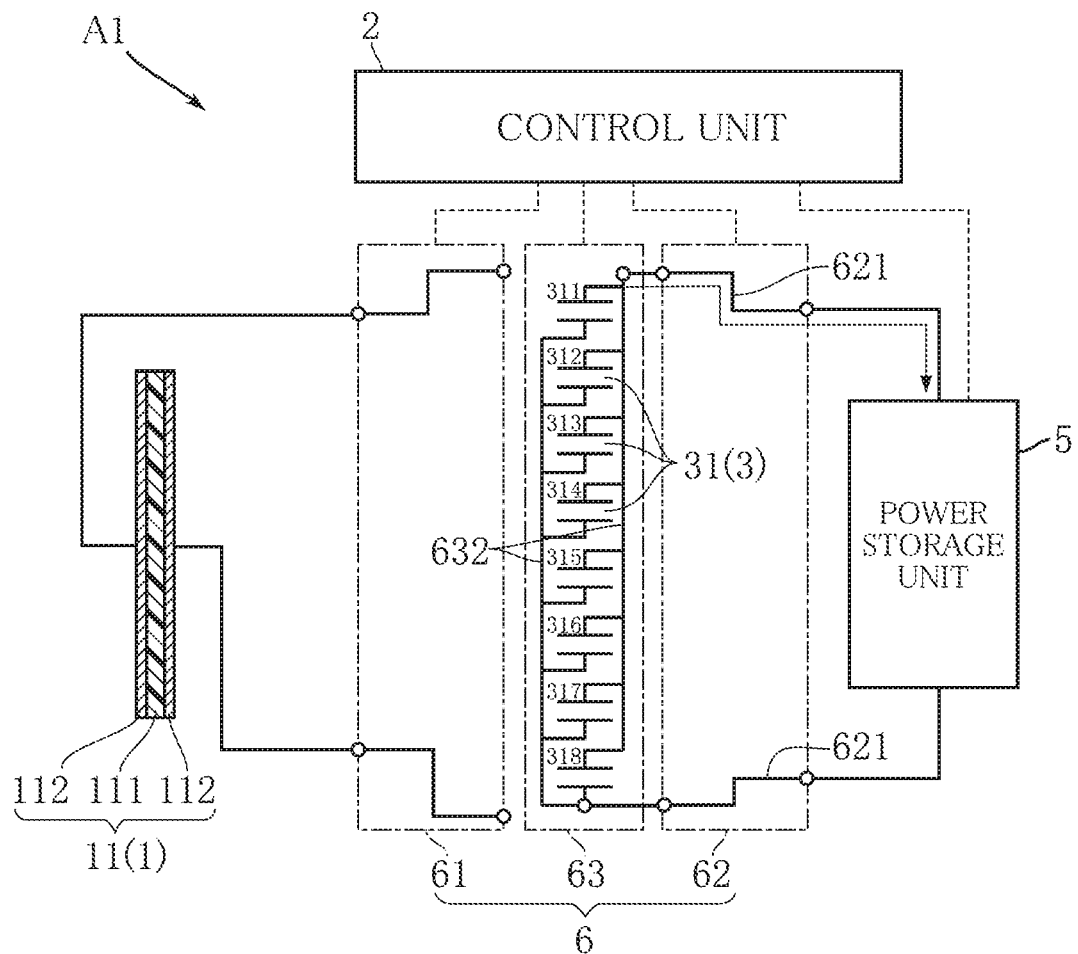
FIG. 4 is a system configuration diagram schematically showing the dielectric elastomer power generation system of FIG. 1.

Subsequently, according to a command of the control unit 2, the switch unit 6, as shown in FIG. 4, disconnects the power generation unit 1 and the intermediate power storage unit 3, and connects the intermediate power storage unit 3 and the power storage unit 5. In the present invention, this mode is defined as an output mode, in which power is output from the intermediate power storage unit 3 to the power storage unit 5. Note that switching between the input mode and the output mode can be performed at any timing, and is judged by the control unit 2 using all sorts of judgment criteria. For example, by monitoring the voltage (input voltage Vi) of power generation by the power generation unit 1, switching from the input mode to the output mode may be performed in the case where the input voltage Vi is zero or a value approaching zero. Alternatively, switching from the input mode to the output mode may be performed in the case where the dielectric elastomer power generation element 11 is not significantly elongating and contracting, using a sensor (not shown) that detects the elongation and contraction state of the dielectric elastomer power generation element 11.

In the illustrated example, an intermediate path 632 is generated within the intermediate switch unit 63, according to a command of the control unit 2, and the eight capacitors 311 to 318 are connected to each other in parallel. These capacitors 311 to 318 are then connected to the power storage unit 5 by the output path 621 of the output-side switch unit 62. In the present invention, the number of series capacitors 31 connected to each other by the intermediate switch unit 63 of the switch unit 6 in the output mode is defined as an output series number. The output series number is a number less than the input series number, and, in the illustrated example, the output series number is one. As a result of this connection, power stored in the capacitors 311 to 318 of the intermediate power storage unit 3 is output to the power storage unit 5. Note that, as shown in FIG. 5, in the present embodiment, the power of the capacitors 311 to 318 is output to the power storage unit 5 from times T12 to T21, which is a longer period of time than times T11 to T12. Also, an output voltage Vo is a lower voltage than the input voltage Vi, and, in the present embodiment, is one eighth of the input voltage Vi. The period of time from times T12 to T21 depends on the time required for the power stored in the capacitors 311 to 318 to be stored in the power storage unit 5.

When the power stored in the capacitors 311 to 318 is stored the power storage unit 5, the output mode is completed. This completion is judged by the control unit 2 monitoring the electric charge state of the capacitors 311 to 318, for example.

As described above, the power generated by the power generation unit 1 from times T11 to T12 is stored in the power storage unit 5 via the intermediate power storage unit 3, completing one cycle of power generation and power storage. Thereafter, in correspondence with the next power generation in the dielectric elastomer power generation element 11, the control unit 2 switches the switch unit 6 to the input mode. Note that FIG. 5 shows the case where the next input mode is started when the output mode is completed at time T21, but an operation example is possible in which a state that is neither the input mode nor the output mode is entered for a predetermined time period after the output mode is completed at time T21. The next cycle of power generation and power storage is then executed by the input mode in times T21 to T22 (similar to the input mode in times T11 to T12) and the output mode in times T22 to T31 (similar to the output mode in times T12 to T21), and, furthermore, the next cycle of power generation and power storage thereafter is executed by the input mode in times T31 to T32 (similar to the input mode in times T11 to T12) and the output mode in times T32 to T41 (similar to the output mode in times T12 to T21).

Next, operation of the dielectric elastomer power generation system A1 will be described.

According to the present embodiment, power generated by the power generation unit 1 is output to the power storage unit 5 after first being stored by the intermediate power storage unit 3. Since power storage of the intermediate power storage unit 3 using the capacitors 31 does not involve a chemical reaction or the like, the power generated by the power generation unit 1 can be quickly stored. Also, the output series number in the output mode in which power is output from the intermediate power storage unit 3 to the power storage unit is less than the input series number in the input mode in which power is input from the power generation unit 1 to the intermediate power storage unit 3. Thus, it is possible to reduce the voltage to the power storage unit 5 in the output mode to lower than the voltage to the intermediate power storage unit 3 in the input mode. This is advantageous in performing power storage by the power storage unit 5 at the proper voltage. Accordingly, with the dielectric elastomer power generation system A1, power generated by the power generation unit 1 can be more efficiently stored in the power storage unit 5.

Also, in the present embodiment, all eight capacitors 311 to 318 in which power is stored in the input mode are connected to each other in parallel in the output mode, and the output series number is set to one. The output voltage Vo shown in FIG. 5 can thereby be reduced to one eighth of the input voltage Vi, this being preferable in efficiently storing power. Note that the ratio of the input voltage Vi and the output voltage Vo will be the ratio of the input series number and the output series number.

FIGS. 6 to 9 show a dielectric elastomer power generation system that is based on a second embodiment of the present invention. Note that, in these diagrams, the same reference signs as the above embodiment are given to elements that are the same as or similar to the above embodiment.

Figure 6:
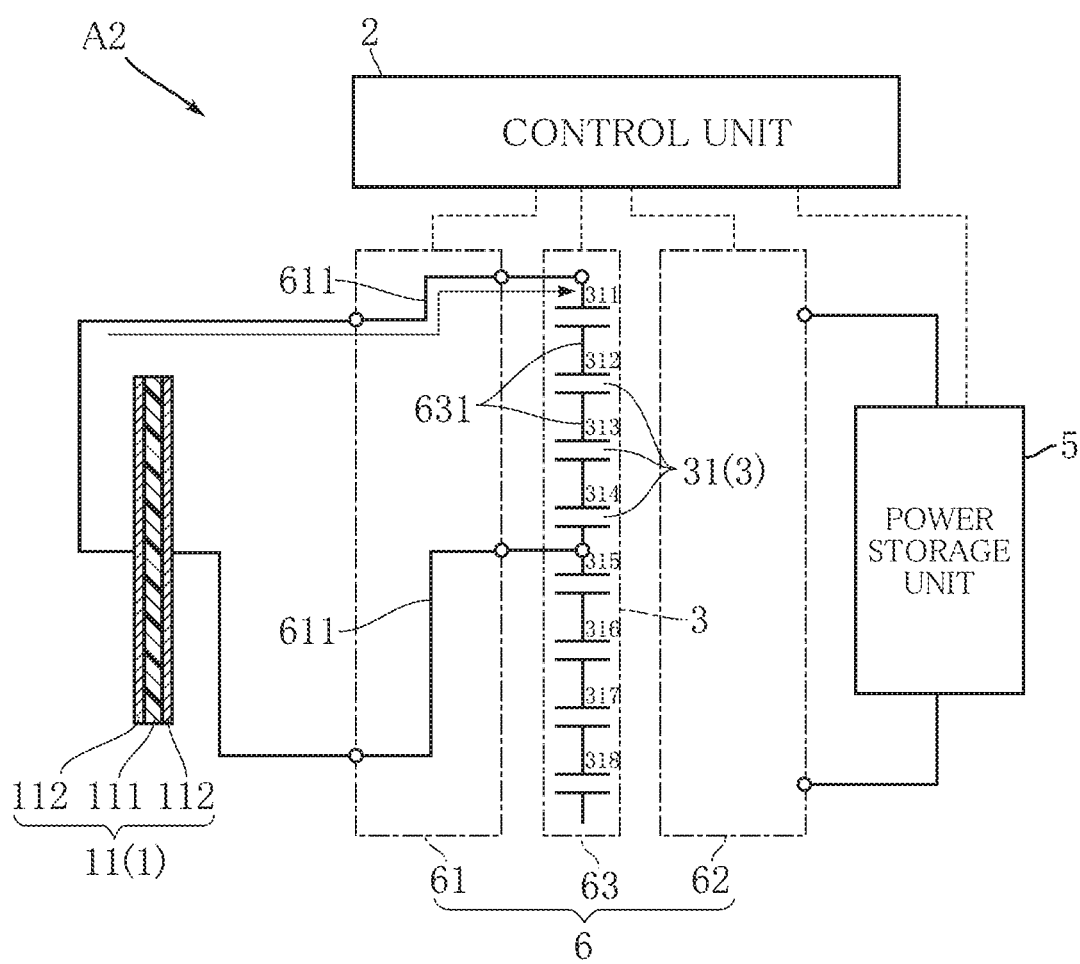
FIG. 6 is a system configuration diagram schematically showing a dielectric elastomer power generation system based on a second embodiment of the present invention.

FIG. 6 shows an input mode of a dielectric elastomer power generation system A2 of the present embodiment. In the present embodiment, the specific number of intermediate power storage unit 3 is eight, similarly to the dielectric elastomer power generation system A1, whereas the input series number is four. That is, the intermediate switch unit 63 generates an intermediate path 631 that connects the four capacitors 311 to 314 to each other in series, according to a command of the control unit 2. Thus, in the illustrated input mode, only the capacitors 311 to 314 store power from the power generation unit 1.

Figure 7:
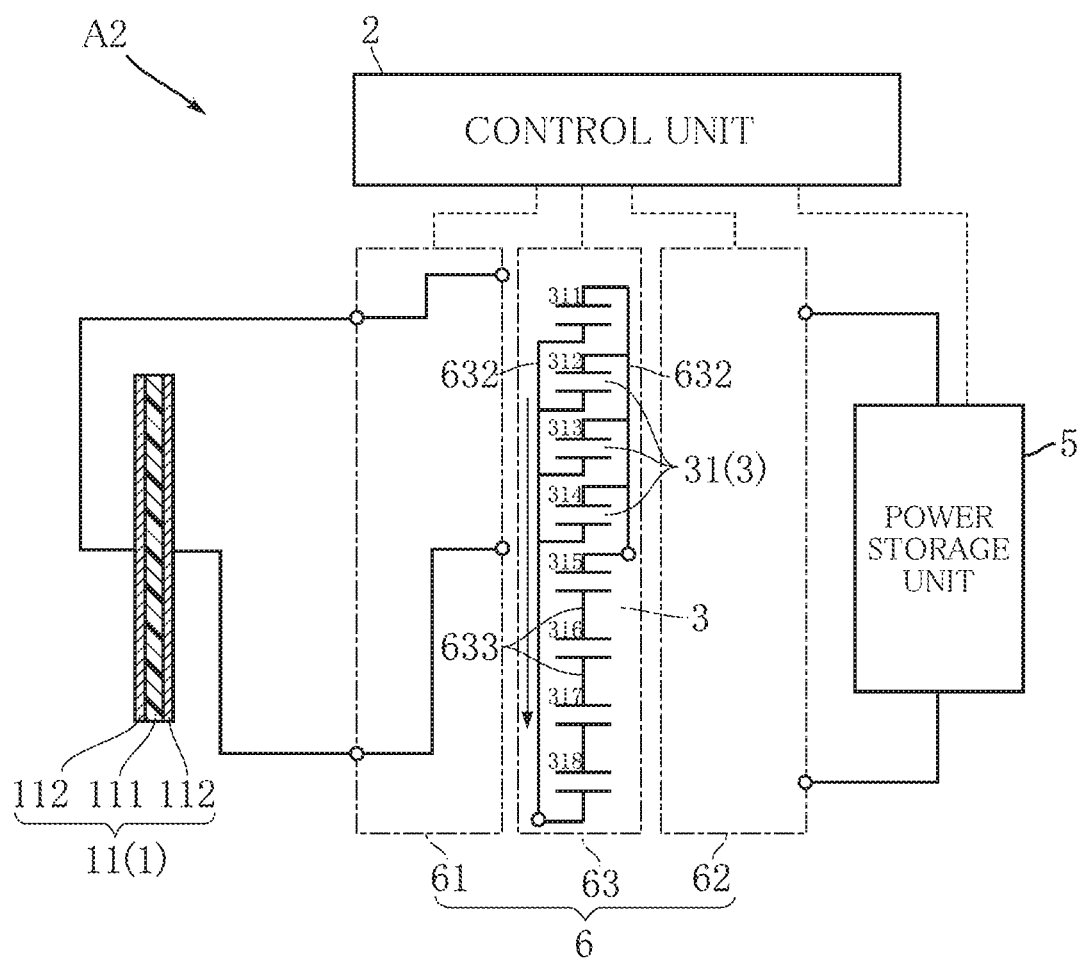
FIG. 7 is a system configuration diagram schematically showing the dielectric elastomer power generation system of FIG. 6.

FIG. 7 shows an intermediate mode that is executed according to a command of the control unit 2, after the input mode shown in FIG. 6. In this intermediate mode, the intermediate switch unit 63 generates an intermediate path 632, and connects the four capacitors 311 to 314 to each other in parallel. In the present invention, all or some number of the plurality of the capacitors 31 in which power is stored in the input mode are connected such that the series number is an intermediate output series number which is a smaller than the input series number. In the illustrated example, all four capacitors 311 to 314 in which power is stored are connected in parallel by the intermediate path 632, and the series number is one. That is, the intermediate output series number is one in this example.

Also, the intermediate switch unit 63 connects the capacitors 315 to 318 that are different from the capacitors 311 to 314 in which power is stored in the input mode to each other by an intermediate path 633, according to a command of the control unit 2. In the present invention, the capacitors 31 are connected such that the input number is an intermediate input series number which is larger than the intermediate output series number. In the illustrated example, the four capacitors 315 to 318 are connected to each other in series by the intermediate path 633, and the intermediate input series number is four.

The stored power is then moved from the capacitors 311 to 314 to the capacitors 315 to 318, by the capacitors 311 to 314 and the capacitors 315 to 318 being connected to each other.

Figure 8:
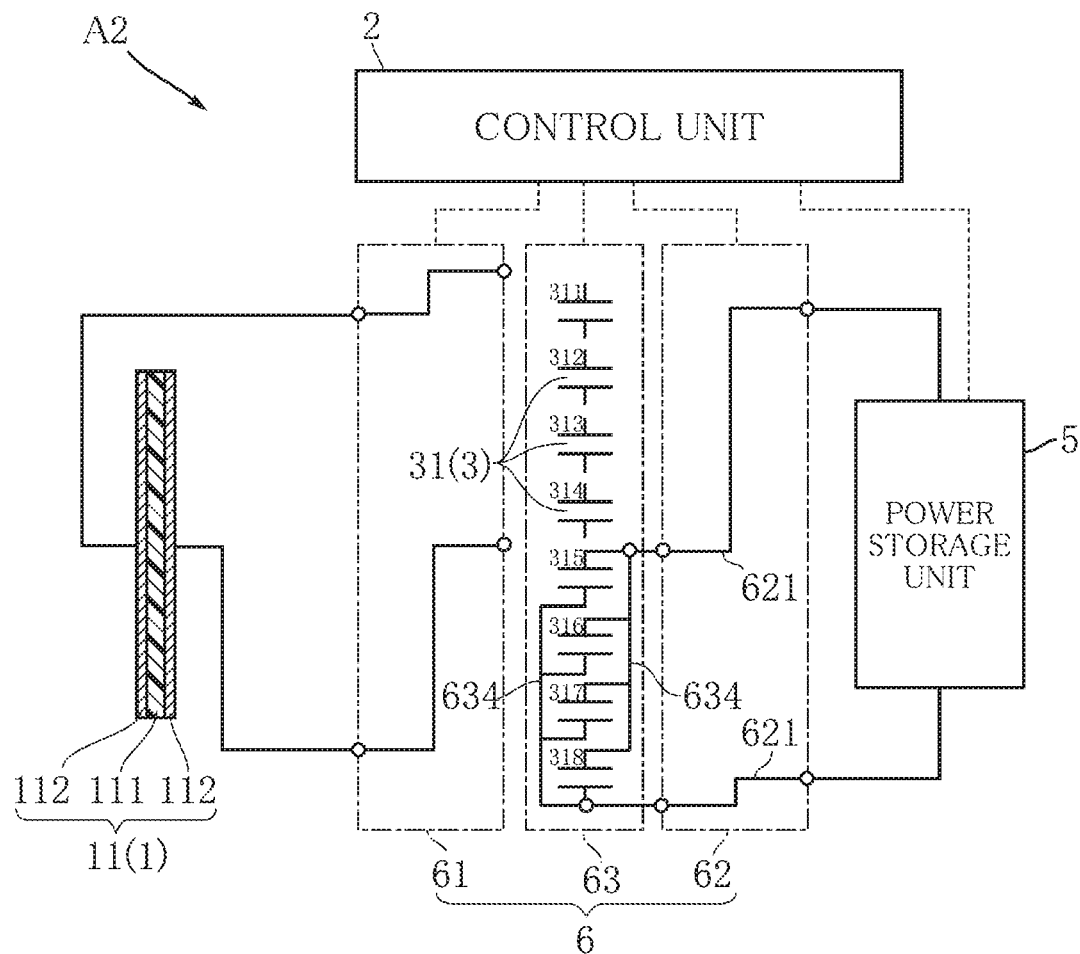
FIG. 8 is a system configuration diagram schematically showing the dielectric elastomer power generation system of FIG. 6.

FIG. 8 shows an output mode that is executed according to a command of the control unit 2, after the intermediate mode shown in FIG. 7. In this output mode, the intermediate switch unit 63 generates an intermediate path 634, according to a command of the control unit 2, and connects the capacitors 315 to 318 in which power is stored in the intermediate mode to each other. In this connection, the capacitors 315 to 318 are connected such that the series number is an output series number which is smaller than the intermediate input series number. In the illustrated example, the four capacitors 315 to 318 are connected to each other in parallel, and the output series number is one. The intermediate switch unit 63 is then connected to the power storage unit 5, by the output path 621 of the output-side switch unit 62. The power stored in the capacitors 315 to 318 is thereby stored in the power storage unit 5.

Figure 9:
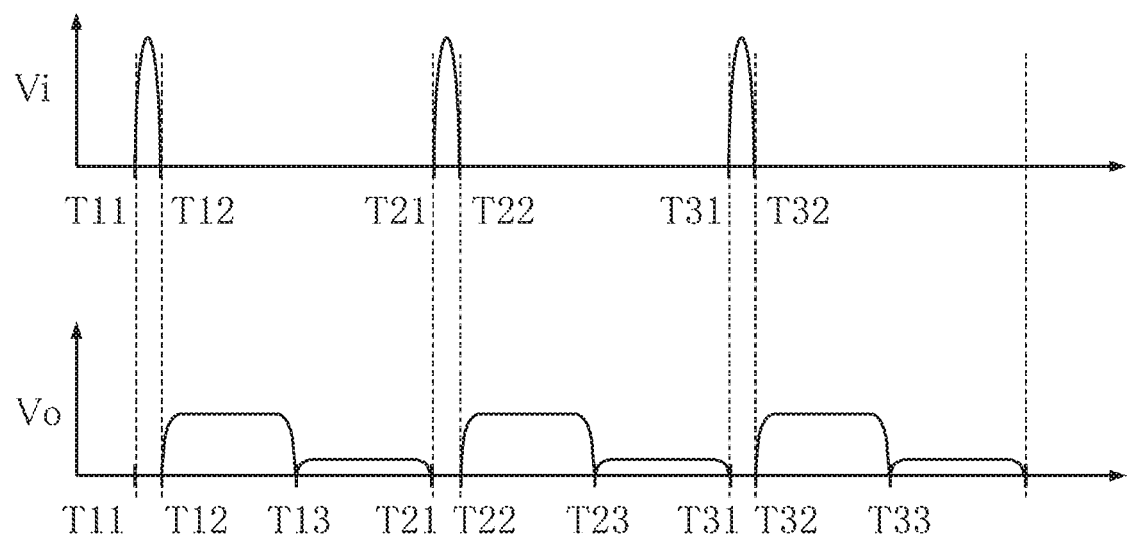
FIG. 9 is a graph showing states of power generation by the dielectric elastomer power generation system of FIG. 6.

FIG. 9 is a graph showing the input mode, the intermediate mode and the output mode in the dielectric elastomer power generation system A2. From times T11 to T12, the input mode is executed at the input voltage Vi. Subsequently, the intermediate mode is executed from times T12 to T13. The output voltage Vo from the capacitors 311 to 315 in the intermediate mode is one quarter of the input voltage Vi. Subsequently, the output mode is executed from times T13 to T21. The output voltage Vo from the capacitors 315 to 318 in the output mode is a further one quarter of the output voltage Vo in the intermediate mode, and is $1/16$ of the input voltage Vi in the input mode.

Similarly, with such an embodiment, power generated by the power generation unit 1 can be more efficiently stored in the power storage unit 5. Also, in the present embodiment, by executing the intermediate mode between the input mode and the output mode, the output voltage Vo in the output mode can be reduced to $1/16$ of the input voltage Vi in the input mode in the example shown in FIG. 9. This is due to the fact that the ratio of the input voltage Vi in the input mode and the output voltage Vo in the output mode will be a ratio obtained by the ratio of the input series number and the intermediate output series number being multiplied by the ratio of the intermediate input series number and the output series number.

The dielectric elastomer power generation system according to the present invention is not limited to the abovementioned embodiments. Various design changes can be freely made to the specific configuration of respective parts of the dielectric elastomer power generation system according to the invention.

The invention claimed is:

1. A dielectric elastomer power generation system comprising:
    a power generation unit including a dielectric elastomer power generation element having a dielectric elastomer layer and a pair of electrode layers that sandwich the dielectric elastomer layer;
    an intermediate power storage unit including a plurality of capacitors of a specific number and configured to receive input of output power from the power generation unit;
    a power storage unit configured to receive input of output power from the intermediate power storage unit; and
    a control unit configured to perform setting control by switching a mode between an input mode and an output mode, wherein
    in the input mode, some number of the plurality of capacitors of the intermediate power storage unit are connected to the power generation unit such that a series number is an input series number of less than or equal to the specific number, and
    in the output mode, some number of the plurality of capacitors are connected to the power storage unit such that the series number is an output series number which is smaller than the input series number, and wherein
    the control unit performs switching between the input mode and the output mode based on monitoring of a voltage of power generation by the power generation unit or detection of an elongation and contraction state of the dielectric elastomer power generation element, and
    the control unit performs the switching at any timing, using all sorts of judgment criteria.

2. The dielectric elastomer power generation system according to claim 1, wherein the control unit, in the output mode, connects capacitors of a number less than or equal to the input series number and larger than the output series number to each other in parallel.

3. A dielectric elastomer power generation system comprising:
    a power generation unit including a dielectric elastomer power generation element having a dielectric elastomer layer and a pair of electrode layers that sandwich the dielectric elastomer layer;

an intermediate power storage unit including a plurality of capacitors of a specific number and configured to receive input of output power from the power generation unit;

a power storage unit configured to receive input of output power from the intermediate power storage unit; and a control unit configured to perform setting control by switching a mode between an input mode, an intermediate mode and an output mode, wherein in the input mode, some number of the plurality of capacitors of the intermediate power storage unit are connected to the power generation unit such that a series number is an input series number of less than or equal to the specific number, in the intermediate mode, the plurality of capacitors in the input mode and the power generation unit are disconnected, some number of the plurality of capacitors connected to the power generation unit in the input mode are connected such that the series number is an intermediate output series number which is smaller than the input series number, and some number of capacitors other than the plurality of capacitors connected to the power generation unit in the input mode, among the plurality of capacitors, are connected such that the series number is an intermediate input series number which is larger than the intermediate output series number, and power is output from the plurality of capacitors connected in the intermediate output series number to the plurality of capacitors connected so as to be in the intermediate input series number, and in the output mode, the plurality of capacitors connected in the intermediate input series number are connected to the power storage unit such that the series number is an output series number which is smaller than the intermediate input series number, and wherein the control unit performs switching from the input mode to the intermediate mode and switching from the intermediate mode to the output mode based on monitoring of a voltage of power generation by the power generation unit or detection of an elongation and contraction state of the dielectric elastomer power generation element, and the control unit performs the switching from the input mode to the intermediate mode and the switching from the intermediate mode to the output mode at any timing, using all sorts of judgment criteria.

4. The dielectric elastomer power generation system according to claim 3, wherein the control unit, in the output mode, connects capacitors of a number less than or equal to the input series number and larger than the output series number to each other in parallel.

* * * * *